US012618899B2

(12) United States Patent
Foong et al.

(10) Patent No.: US 12,618,899 B2
(45) Date of Patent: May 5, 2026

(54) METHOD FOR ALIGNING CONTACT PINS IN AN INTEGRATED CIRCUIT TESTING APPARATUS

(71) Applicant: JF MICROTECHNOLOGY SDN. BHD., Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY); Caleb Lim, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 269 days.

(21) Appl. No.: 18/126,431

(22) Filed: Mar. 25, 2023

(65) Prior Publication Data

US 2023/0314501 A1      Oct. 5, 2023

(30) Foreign Application Priority Data

Mar. 30, 2022      (MY) ........................... PI 2022001699

(51) Int. Cl.
*G01R 31/28*      (2006.01)

(52) U.S. Cl.
CPC .................................. *G01R 31/2886* (2013.01)

(58) Field of Classification Search
CPC .............. G01R 1/0416; G01R 1/07307; G01R 1/07371; G01R 31/2851; G01R 31/2886
See application file for complete search history.

(56) References Cited

U.S. PATENT DOCUMENTS

2017/0219624 A1*   8/2017   Foong ................ G01R 31/2886
2018/0335473 A1*  11/2018   Foong ................ G01R 31/2887

* cited by examiner

*Primary Examiner* — Eman A Alkafawi
*Assistant Examiner* — Suresh K Rajaputra
(74) *Attorney, Agent, or Firm* — Maschoff Brennan

(57) ABSTRACT

A method of aligning one or more rows of contact pins in an integrated circuit (IC) device testing apparatus that uses structures in bottom plates of the assembly itself to align rows of contact pins. Once a row of contact pins has been inserted into slots located on a socket body in the y-axis, one of the bottom plates is lowered onto the socket body. Some structures on the bottom plate restrict it to movement primarily in the x-axis with respect to the socket body, while other structures allow it to capture all misaligned contact pins and "comb" them into alignment by small adjustments in the x-axis. In this way, the rows of contact pins are aligned as part of the assembly process itself, and no additional tools or equipment are needed.

10 Claims, 9 Drawing Sheets

METHOD FOR ALIGNING CONTACT PINS IN AN INTEGRATED CIRCUIT TESTING APPARATUS

FIELD OF INVENTION

The present invention relates generally to a method for aligning contact pins in an integrated circuit (IC) device testing apparatus, and more specifically to such a method that allows for easy and accurate aligning of at least one row of contact pins in the testing apparatus.

BACKGROUND OF INVENTION

An integrated circuit (IC) device testing apparatus is used to evaluate performance of the IC device, and to remove from further production those IC devices that are faulty. In some types of IC device testing apparatus, there are rows of contacts pins within the testing apparatus that provide electrical connections between the device being tested and a load board. These rows of contact pins can be either straight, or uneven, depending on the configuration of the contact pads on the device being tested. One contact type used in some types of IC device testing is known as a Kelvin contact, which is essentially a pair of contact pins comprising an inner and an outer contact pin that are physically very close, but not in electrical contact with each other. When a row of these Kelvin contacts is assembled in a testing apparatus, one problem that ensues is the difficulty in ensuring that the entire row of contacts is aligned as required. Each contact pin pair must be inserted into the testing apparatus one by one, and once the row is completely inserted, the contact pin pairs are almost always unaligned and haphazard.

A known solution to the problem of misaligned contact pins during assembly of a testing apparatus is to use an alignment tool along with a pair of spacers to align the contact pins. The alignment tool is used to align one row (either the outer or inner row) of contact pins first, then a spacer is used to hold that row in position. The alignment tool is then used to align the other row, before a second spacer holds that in position. This is a very cumbersome process which adds significantly to the time it takes to assemble the testing apparatus, not to mention the additional material needed in the way of the tool and spacers.

What is needed in the art is a method of aligning the row of contact pins without the need for any additional tools and which can simplify and reduce the time it takes to assemble a testing apparatus.

SUMMARY OF INVENTION

The present invention seeks to overcome the aforementioned disadvantages by providing a method of aligning one or more rows of contact pins in an integrated circuit (IC) device testing apparatus that uses structures in bottom plates of the assembly itself to align rows of contact pins. Once a row of contact pins has been inserted into slots located on a socket body in the y-axis, one of the bottom plates is lowered onto the socket body. Some structures on the bottom plate restrict it to movement primarily in the x-axis with respect to the socket body, while other structures allow it to capture all misaligned contact pins and "comb" them into alignment by small adjustments in the x-axis. In this way, the rows of contact pins are aligned as part of the assembly process itself, and no additional tools or equipment are needed.

The novelty and inventiveness of this invention is the use of specific structures in the bottom plates of the assembly itself to align rows of contact pins. This works for both a double row of contact pins such as that seen when Kelvin contacts are used in the testing apparatus, as well as for a single row of contact pins. This invention thus has two main embodiments. The first main embodiment covers the Kelvin contact case, where there is a double row of contact pins, that is where there is a row of inner contact pins and a row of outer contact pins located very close to each other. The second main embodiment covers the case where there is only a single row of contact pins.

The first main embodiment of this invention thus relates to a method for aligning a row of contact pin pairs in an integrated circuit (IC) device testing apparatus, comprising:

a. placing a row of inner contact pins and a row of outer contact pins, each inner contact pin and its corresponding outer contact pin forming a contact pin pair, into a row of slots located on a socket body, said rows being in a y-axis, and each said inner contact pin having a top end for electrically contacting a corresponding contact pad of an IC device under test, and a bottom end for electrically contacting a corresponding contact pad of a load board, and each said outer contact pin likewise having a top end for electrically contacting a corresponding contact pad of an IC device under test, and a bottom end for electrically contacting a corresponding contact pad of a load board; and b. lowering a first bottom plate in a z-axis and towards said socket body, said first bottom plate provided with a slit with a profile that matches the desired final alignment of said row of outer contact pin bottom ends, said slit chamfered on at least one of its upper edges such that an upper opening of said slit is wider than a lower opening of said slit, said wider upper opening allowing for easier inclusion of any misaligned outer contact pin bottom ends into said slit so that all outer contact pin bottom ends are then aligned as desired once said first bottom plate is fully lowered onto said socket body.

c. wherein the first bottom plate provided with a cut out at its inner side with a profile that matches the desired final positioning of said row of inner contact pin bottom ends, said cut out chamfered on its upper edge allowing for easier inclusion of any misaligned inner contact pin bottom ends into said cut out so that all inner contact pin bottom ends are moved to said inner side of the cut out once said first bottom plate is fully lowered onto said socket body, lowering a center cover plate in a z-axis and towards said socket body, said center cover plate located adjacent to said first bottom plate and provided with a chamfer on an upper edge (742) of a side that is adjacent to the first bottom plate cut out (54), said chamfer allowing for easier inclusion of any misaligned inner contact pin bottom ends into a slit formed by said center cover plate cut out and said first bottom plate cut out once the center cover plate is fully lowered onto the socket body.

In the instance where the desired alignment of the row of inner contact pins is not straight, it may be necessary for the center cover plate to be provided with a cut out (74) on a side that is adjacent to the first bottom plate. The cut out having a matching profile with the first bottom plate cut out.

The first bottom plate is provided with at least one through-hole, each said at least one through-hole positioned to receive an upwards-protruding dowel pin, each said at least one through-hole elongated in an x-axis so that once said dowel pin is engaged through it, the entire first bottom plate is able to move primarily only in the x-axis direction and only in a range provided by the elongation of the said through-hole. In a preferred embodiment, there are two through-holes located on the first bottom plate, to provide more restriction of the bottom plate in directions other than in the x-axis. The dowel pin protrudes upwards at least to a height that allows its said engagement with said through-hole to happen before said row of outer contact pin bottom ends reaches said upper opening of said slit and also before said row of inner contact pin bottom ends reaches said upper edge of said cut out, as said first bottom plate is lowered onto said socket body. The first bottom plate is also provided with a means of securing its position with respect to said socket body once the said rows of outer contact pin bottom ends and inner contact pin bottom ends have been aligned as desired.

In a preferred embodiment, the inner contact pin has a body portion in between the said bottom end and said top end, said body comprising an upwards curve joined to a downwards curve, which curves form an "S" shape in a middle portion of said inner contact pin, and the said inner contact pin bottom end extending vertically from a right-angle joint with said body, and wherein each said outer contact pin has a body portion in between the said bottom end and said top end, said body comprising an upwards curve joined to a downwards curve, which curves form an "S" shape in a middle portion of said outer contact pin, and the said outer contact pin bottom end extending vertically from a right-angle joint with said body.

The second main embodiment of this invention thus relates to a method for aligning a row of contact pins in an integrated circuit (IC) device testing apparatus, comprising:

a. placing a row of contact pins into a row of slots located on a socket body, said rows being in an x-axis, and each said contact pin having a top end for electrically contacting a corresponding contact pad of an IC device under test, and a bottom end for electrically contacting a corresponding contact pad of a load board; and b. lowering a center cover plate in a z-axis and towards said socket body, said center cover plate provided with a slit with a profile that matches the desired final alignment of said row of contact pin bottom ends, said slit chamfered on at least one of its upper edges such that an upper opening of said slit is wider than a lower opening of said slit, said wider upper opening allowing for easier inclusion of any misaligned contact pin bottom ends into said slit so that all contact pin bottom ends are then aligned as desired and locked in a y-axis direction once said center cover plate is fully lowered onto said socket body.

The center cover plate is provided with a means of securing its position with respect to said socket body once the said rows of contact pin bottom ends have been aligned into said slit.

In a preferred embodiment, the contact pin has a body portion in between the said bottom end and said top end, said body comprising an upwards curve joined to a downwards curve, which curves form an "S" shape in a middle portion of said contact pin, and the said contact pin bottom end extending vertically from a right-angle joint with said body.

This invention thus provides an elegant solution to the problem of aligning rows of contact pins in a testing apparatus. This invention eliminates the need for using an extra alignment tool and spacers for aligning the rows of contact pins.

Another advantage of this invention is that it allows for easy removal or replacement of any damaged or worn contact pins. Since the contact pins are secured into the slots on the socket body, the removal or replacement of contact pins merely entails removing the bottom plate that secures the contact pins onto the socket body.

Yet another advantage of this invention is that it eliminates the need for creating datums on each individual contact pin. A common practice now is to have structural members, for examples hooks, on each contact pin to create a datum so that each contact pin can be aligned to the load board. These additional structures on the contact pin are an additional cost that is now made unnecessary by the solution provided by this invention.

Other objects and advantages will be more fully apparent from the following disclosure and appended claims.

REFERENCE LIST

Figure 1:
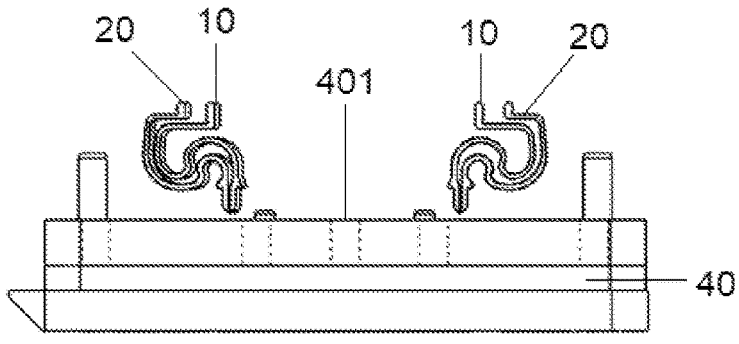
FIG. 1 shows a front view of a socket body and contact pins in a first main embodiment of the present invention.

Inner contact pin (10)
Inner contact pin top end (12)
Inner contact pin body (14)
Inner contact pin bottom end (16)
Outer contact pin (20)

Outer contact pin top end (22)
Outer contact pin body (24)
Outer contact pin bottom end (26)
Contact pin (30)
Contact pin top end (32)
Contact pin body (34)
Contact pin bottom end (36)
Socket body (40)
Socket body underside (401)
Socket pin first slots (44)
Socket body first dowel pin (442)
Socket body second dowel pin (444)
Socket pin second slots (45)
Socket body third dowel pin (452)
Socket body fourth dowel pin (454)
Socket pin third slots (46)
Socket pin fourth slots (47)
First bottom plate (50)
First bottom plate slit (52)
First bottom plate slit inner upper edge (522)
First bottom plate slit outer upper edge (524)
First bottom plate cut out (54)
First bottom plate cut out upper edge (542)
First bottom plate first through hole (56)
First bottom plate second through hole (58)
First bottom plate reference through hole (59)
Second bottom plate (60)
Second bottom plate slit (62)
Second bottom plate slit inner upper edge (622)
Second bottom plate slit outer upper edge (624)
Second bottom plate cut out (64)
Second bottom plate cut out upper edge (642)
Second bottom plate first through hole (66)
Second bottom plate second through hole (68)
Second bottom plate reference through hole (69)
Center cover plate (70)
Center cover plate first cut out (74)
Center cover plate first cut out upper edge (742)
Center cover plate first slit (76)
Center cover plate first slit inner upper edge (762)
Center cover plate first slit outer upper edge (764)
Center cover plate second slit (77)
Center cover plate second slit inner upper edge (772)
Center cover plate second slit outer upper edge (774)

DETAILED DESCRIPTION OF INVENTION

It should be noted that the following detailed description is directed to a method of aligning a row of contact pins in an integrated circuit (IC) testing apparatus, and is not limited to any particular size or configuration but in fact a multitude of sizes and configurations within the general scope of the following description.

Figure 13:
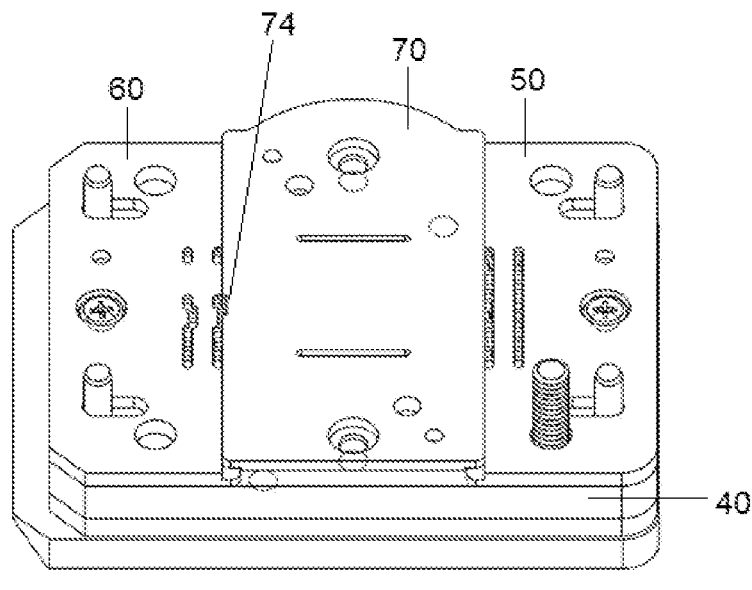
FIG. 13 shows a perspective view of a testing apparatus in a first main embodiment of the present invention.
Figure 14:
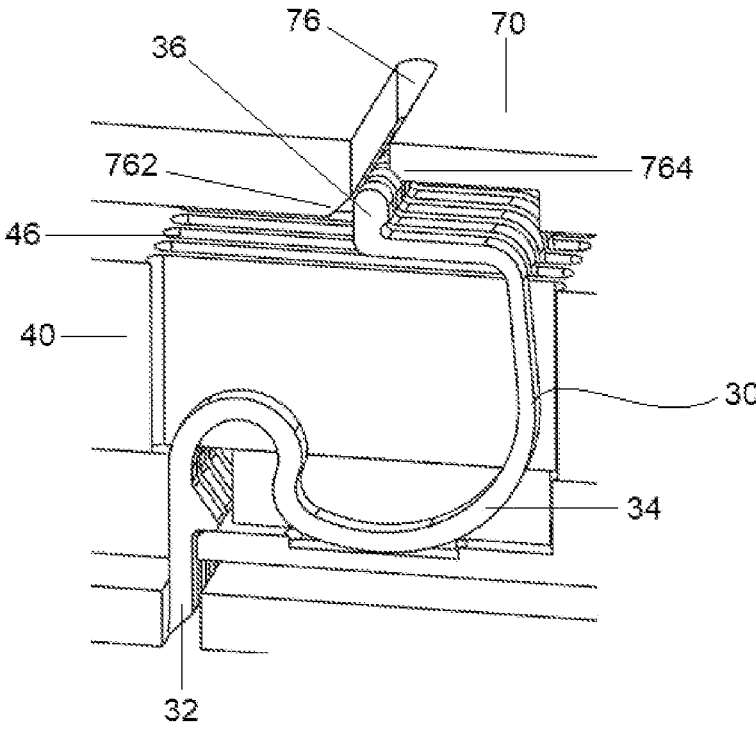
FIG. 14 shows a cross-sectional view of a testing apparatus in a second main embodiment of the present invention.
Figure 15:
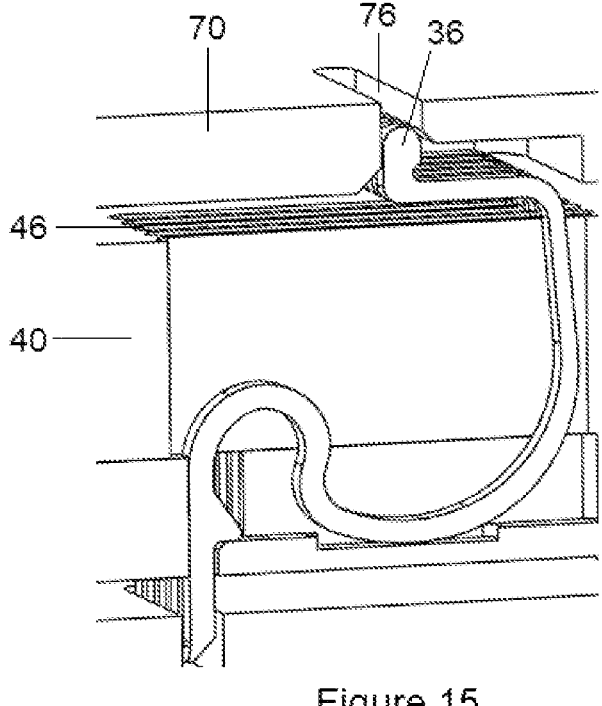
FIG. 15 shows a cross-sectional view of a testing apparatus in a second main embodiment of the present invention.
Figure 16:
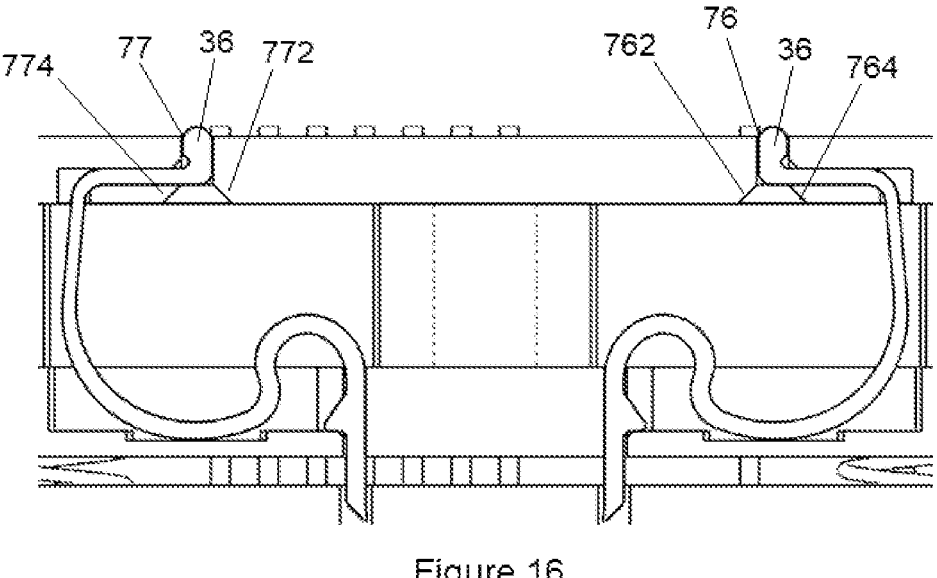
FIG. 16 shows a cross-sectional view of a testing apparatus in a second main embodiment of the present invention.

The novelty and inventiveness of this invention is the use of specific structures in the bottom plates of the assembly itself to align rows of contact pins. This works for both a double row of contact pins such as that seen when Kelvin contacts are used in the testing apparatus, as well as a single row of contact pins. This invention thus has two main embodiments. The first main embodiment covers the Kelvin contact case, where there is a double row of contact pins, that is where there is a row of inner contact pins and a row of outer contact pins located very close to each other, and is illustrated in FIGS. 1 through 13. The second main embodiment covers the case where there is only a single row of contact pins, and is illustrated in FIGS. 14 through 16. FIG.

17 shows the testing apparatus as a whole, in order to illustrate how this invention is incorporated within.

Figure 2:
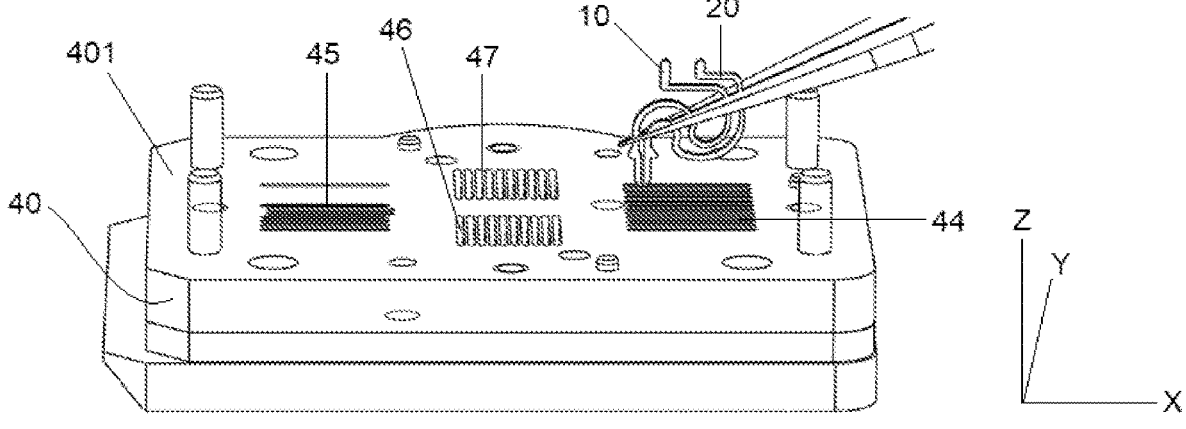
FIG. 2 shows a perspective view of a socket body and contact pins in a first main embodiment of the present invention.

Referring to FIGS. 1 and 2, there can be seen an IC device testing apparatus being assembled. Many different configurations of testing apparatus can apply the method of this invention, however, the particular configuration illustrated here comprises a rectangular-shaped socket body (40) with four sides of pin rows. A first and second side of pins positioned opposite each other with respect to the center of the rectangle each contains rows of kelvin contact pin pairs along the y-axis. A third and fourth side of pin rows also positioned opposite each other contain rows of single pins along the x-axis. A row of first slots (44) is embedded into an underside (401) of the socket body (40) on its said first side. A row of second slots (45) is embedded into the underside (401) of the socket body (40) on its said second side. A row of third slots (46) is embedded into the underside (401) of the socket body (40) on its said third side. A row of fourth slots (47) is embedded into the underside (401) of the socket body (40) on its said fourth side. Each kelvin contact pin pair rows comprise a row of inner contact pins (10) and a row of outer contact pins (20). During assembly of the testing apparatus, a row of inner contact pins (10) and outer contact pins (20) forming the kelvin contact pin pair is inserted into the first slots (44). The socket body (40) has been turned upside down for this stage of the assembly, so that its underside (401) is facing upwards. Each pair of inner (10) and outer (20) contact pins is manually inserted into each slot (44) with a pair of tweezers or some equally suitable tool.

Figure 3:
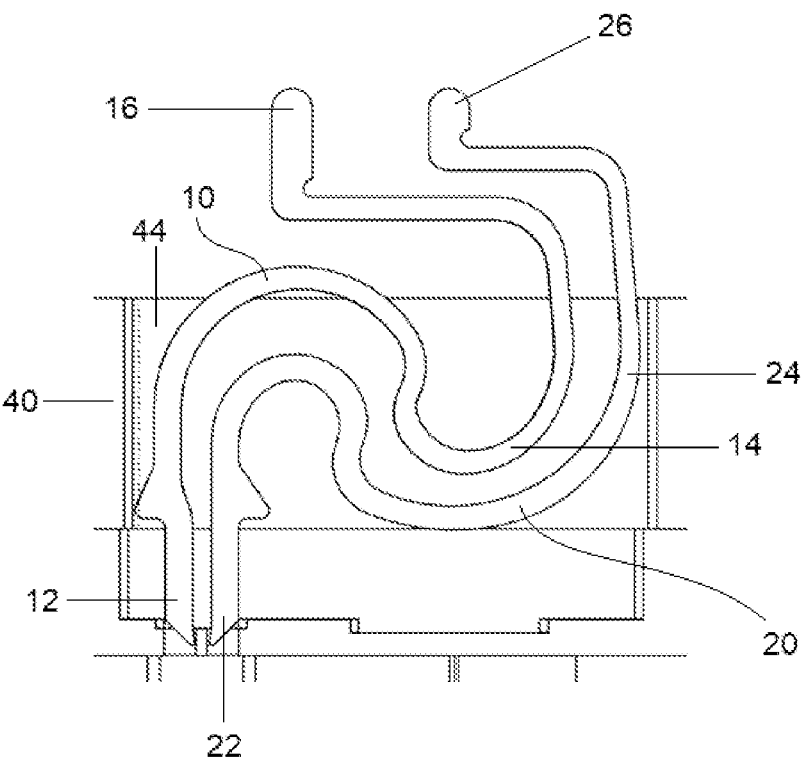
FIG. 3 shows a cross-sectional view of a socket body and contact pins in a first main embodiment of the present invention.

FIG. 3 shows a cross-sectional view of the row of contact pin pairs (10, 20) inserted into the first slots (44) of the socket body (40). In this close up view, there is also shown details of each contact pin. The inner contact pin (10) comprises a top end (12), which establishes electrical contact with contact pads of an IC device being tested, and connected via a curved body (14) to a bottom end (16), which establishes electrical contact with a load board of the testing apparatus. Similarly, the outer contact pin (20) comprises a top end (22), which establishes electrical contact with contact pads of an IC device being tested, and connected via a curved body (24) to a bottom end (26), which establishes electrical contact with a load board of the testing apparatus.

Still referring to FIG. 3, although the alignment method of this invention can be applied to many types and shapes of pin, it works especially well for the pin design as seen in FIG. 3, whereby each said inner contact pin body (14) comprises an upwards curve joined to a downwards curve, which curves form an "S" shape in a middle portion of said inner contact pin (10), and the said inner contact pin bottom end (16) extends vertically from a right-angle joint with said body (14). Similarly, each said outer contact pin body (24) comprises an upwards curve joined to a downwards curve, which curves form an "S" shape in a middle portion of said outer contact pin (20), and the said outer contact pin bottom end (26) extends vertically from a right-angle joint with said body (24).

Figure 4:
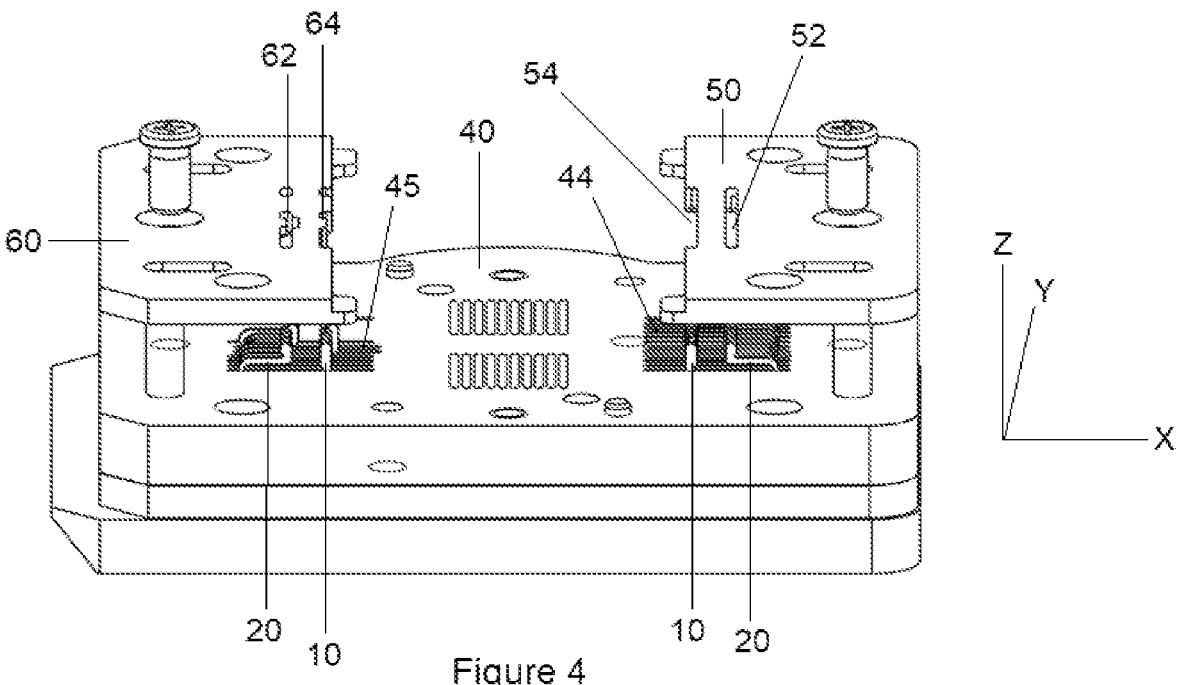
FIG. 4 shows a perspective view of a socket body and bottom plates in a first main embodiment of the present invention.

Referring now to FIG. 4, once all contact pin pairs (10, 20) have been inserted into the first slots (44) and second slots (45), a first bottom plate (50) is lowered down along the z-axis and towards the underside of the socket body (40) above the first slots (44), and a second bottom plate (60) is lowered down along the z-axis and towards the underside of the socket body (40) above the second slots (45). The first bottom plate (50) is provided with a slit (52) elongated in the y-axis and a cut out (54) along an inner edge also elongated in the y-axis. The second bottom plate (60) is also provided with a slit (62) elongated in the y-axis and a cut out (64) along an inner edge also elongated in the y-axis.

In FIG. 4, it is shown that the first bottom plate slit (52) and first bottom plate cut out (54) has a straight alignment, and the second bottom plate slit (62) and second bottom plate cut out (64) has a crooked alignment. However, this is only to show that any type of alignment is possible for the slits (52, 62) and cut outs (54, 64). The alignment of these elements purely depends on the final desired alignment of the contact pin bottom ends (16, 26). In all other respects, the first bottom plate (50) and the second bottom plate (60) are mirror images of each other. As can be seen in FIG. 4, as the first bottom plate (50) is lowered towards the socket body (40), the first bottom plate slit (52) hovers roughly above the outer contact pin bottom ends (26), and the first bottom plate cut out (54) hovers roughly above the inner contact pin bottom ends (16) which were inserted in the first slots (44). The same is true for the second bottom plate slit (62) and cut out (64) over the outer contact pin bottom ends (26) and inner contact pin bottom ends (16) inserted into the second slots (45), respectively, in a mirror image of the first bottom plate.

Figure 5:
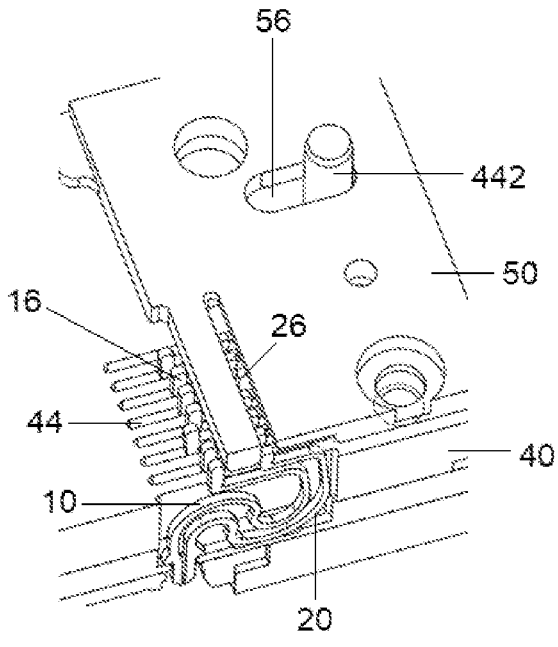
FIG. 5 shows a cross-sectional view of a socket body and bottom plate in a first main embodiment of the present invention.
Figure 6:
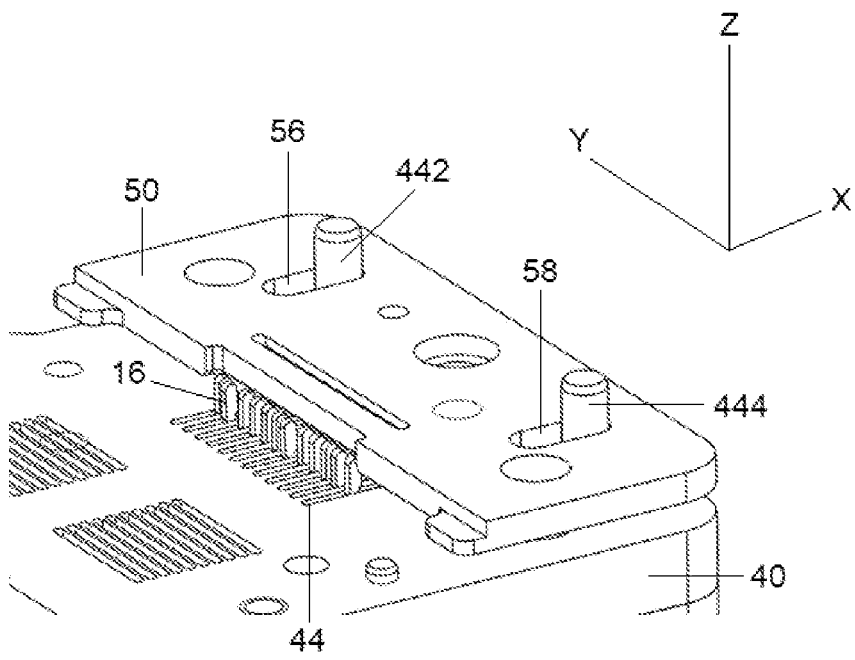
FIG. 6 shows a perspective view of a socket body and bottom plate in a first main embodiment of the present invention.

FIGS. 5 and 6 show cross-sectioned and perspective views, respectively, of the first side of the socket body (40) with the first slots (44) having been populated by a row of the contact pin pairs comprising inner contact pins (10) and outer contact pins (20). As can be seen, the contact pin bottom ends (16, 26) are not aligned as desired, but in fact haphazard and misaligned. As the first bottom plate (50) is lowered towards the socket body (40) along the z-axis, a pair of through holes (56, 58) located on the first bottom plate (50) is positioned to receive a pair of dowel pins (442, 444) protruding upwards from the underside of the socket body (40). The dowel pins (442, 444) protrude upwards at least to a height that allows its engagement with the through-holes (56, 58) to happen before the row of outer contact pin bottom ends (26) reaches the slit (52) and also before the row of inner contact pin bottom ends (16) reaches the cut out (54), as the first bottom plate (50) is lowered onto the socket body (40). The pair of through holes comprising a first through hole (56) and a second through hole (58) are elongated in the x-axis, such that once the dowel pins (442, 444) are engaged through them, the first bottom plate (50) is restricted from movement with respect to the socket body (40) in the y-axis, and has limited movement with respect to the socket body (40) in the x-axis, the amount of x-axis movement dependent on the length of elongation of the through holes (56, 58). This allows the operator assembling the testing apparatus to "comb" the misaligned row of outer contact pin bottom ends (26) into the confines of the slit (52) and the row of misaligned inner contact pin bottom ends (16) to an inner side of the cut out (54), by slight movements and adjustments of the first bottom plate (50) in the x-axis.

Figure 7:
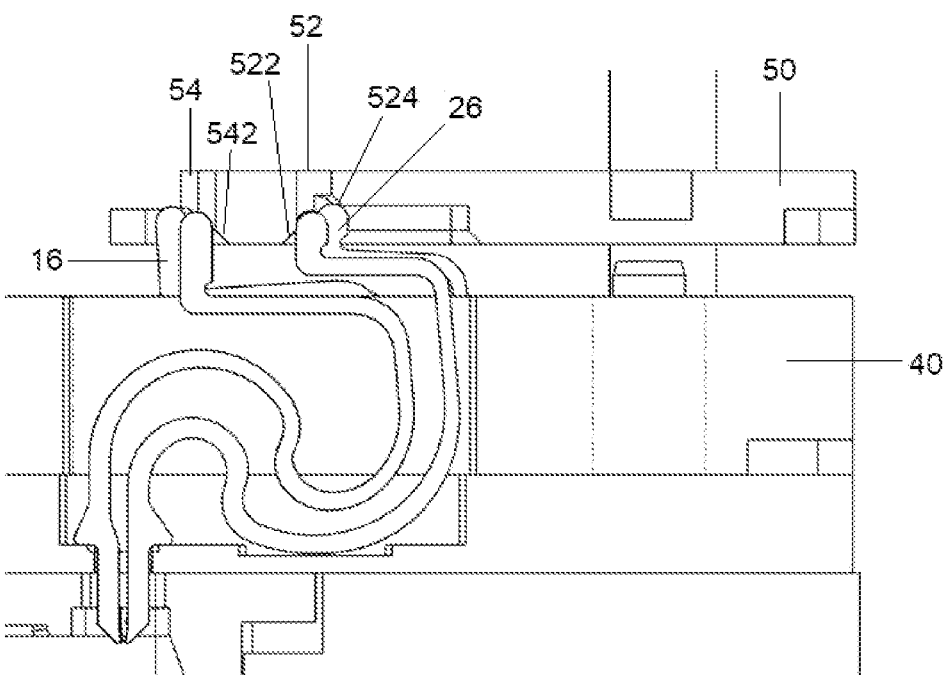
FIG. 7 shows a cross-sectional view of a socket body and bottom plate in a first main embodiment of the present invention.
Figure 8:
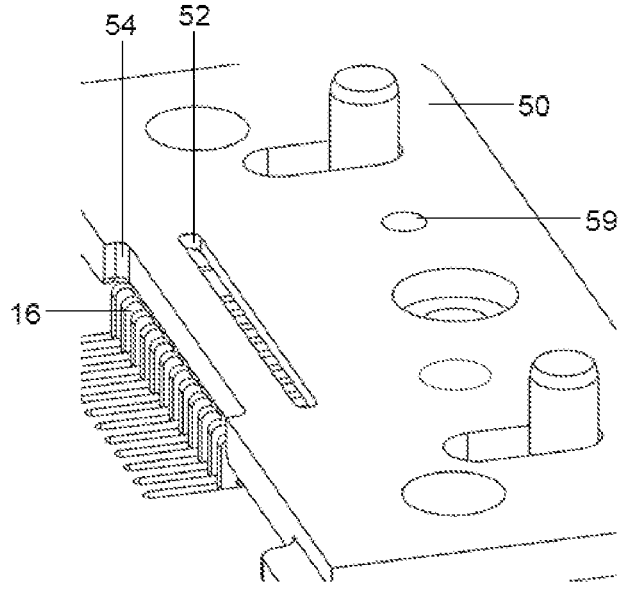
FIG. 8 shows a perspective view of a socket body and bottom plate in a first main embodiment of the present invention.
Figure 9:
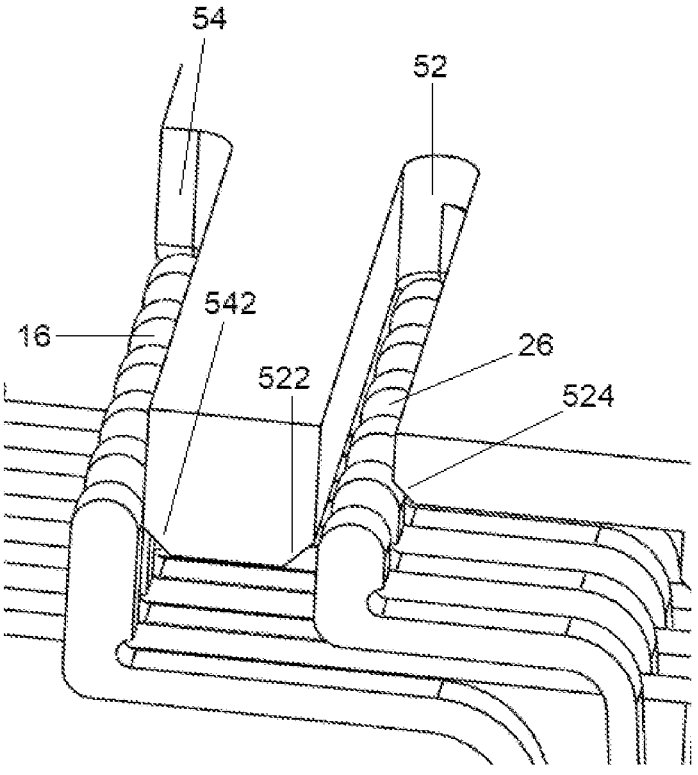
FIG. 9 shows a cross-sectional view of contact pins and bottom plate in a first main embodiment of the present invention.

FIGS. 7, 8 and 9 show views of the first bottom plate (50) engaging with the rows of outer contact pin bottom ends (26) and inner contact pin bottom ends (16). The slit (52) is chamfered along its length on both its inner upper edge (522) and outer upper edge (524). This chamfering provides the slit (52) with a wider upper opening, which opening receives the outer contact pin bottom ends (26), and a narrower lower opening (since the entire assembly is upside down at this stage of the assembly, what we call "upper opening" is shown in these figures as being at the bottom, and vice versa). The cut out (54) is also provided with a chamfer on its upper edge (542), providing the cut out (54) with a wider upper opening and a narrower lower opening. The wider upper openings of both the slit (52) and cut out (54) allow for easier inclusion of all misaligned outer contact pin bottom ends (26) and inner contact pin bottom ends (16) into the slit (52) and the cut out (54), respectively.

Still referring to FIGS. 7, 8 and 9, the operator assembling the testing apparatus moves the first bottom plate (50) slightly back and forth in the x-axis direction as the first bottom plate (50) is lowered towards the socket body (40) so that all outer contact pin bottom ends (26) are "combed" into the slit (52), and all inner contact pin bottom ends (16) are "combed" towards the inner side of the cut out (54). The first bottom plate (50) is then lowered fully onto the socket body (40) so that the row of outer contact pin bottom ends (26) is aligned according to the profile of the lower opening of the slit (52) and locked in an x-axis direction by the slit (52). In this way, a misaligned row of outer contact pins (20) is easily aligned as desired by forming on the first bottom plate (50) a slit (52) with a wider upper opening and a lower opening having a profile according to the particular pin alignment as required in a test.

Still referring to FIGS. 7, 8 and 9, a first bottom plate (50) is lowered down in the z-axis towards the socket body (40). The first bottom plate (50) is provided with a slit (52), which is a through opening in the first bottom plate (50) elongated in the y-axis. This slit (52) is chamfered along both its inner upper edge (522) and outer upper edge (524). This chamfering results in an upper opening of the slit to be wider than its lower opening. The wider opening of the upper side of the slit (52) facilitates inclusion of all misaligned outer contact pin bottom ends (26) into the slit (52), so that further lowering of the first bottom plate (50) towards the socket body (40) forces all outer contact pin bottom ends (26) to be aligned as desired, that is along the profile on the lower side of the slit (52). The first bottom plate (50) is also provided with a cut out (54) along its inner side. The cut out (54) is an indentation along an inner side of the first bottom plate (50), and is also elongated in the y-axis. The cut out (54) is chamfered along its upper edge (542), such that the cut out (54) is wider on its upper side than on its lower side. The wider opening of the lower side of the cut out (54) facilitates inclusion of all misaligned inner contact pin bottom ends (16) into the cut out (54), so that further lowering of the first bottom plate (50) towards the socket body (40) forces all inner contact pins bottom ends (16) to move to an inner side of the cut out (54).

The first bottom plate (50) is also provided with a reference through hole (59) that is positioned adjacent to a matching hole embedded in the socket body (40). Once the row of outer contact pin bottom ends (26) is safely within the confines of the slit (52) and the first bottom plate (50) is fully lowered onto the socket body (40), a dowel is inserted through the reference through hole (59) and into the said matching hole within the socket body (40) to lock the first bottom plate (50) in place, so that it is now restricted from movement in both the x and y-axis. Lastly, a fastener such as a screw is used to secure the first bottom plate (50) to the socket body (40), which then further restricts movement of the first bottom plate (50) in the z-axis, thus securing the first bottom plate (50) to the socket body (40).

Figure 10:
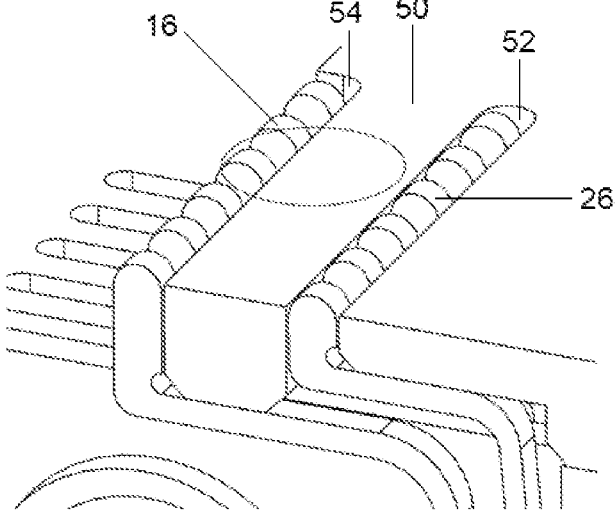
FIG. 10 shows a cross-sectional view of contact pins and bottom plate in a first main embodiment of the present invention.

Referring now to FIG. 10, there is shown a cross-sectional view of the first main embodiment of this invention, after a row of outer contact pin bottom ends (26) have been successfully aligned as desired in a slit (52) provided on a first bottom plate (50). At this point, the inner contact pin bottom ends (16), whilst contained on the inner side of the cut out (54), are not necessarily yet aligned as desired.

Since the first bottom plate (50) and second bottom plate (60) are mirror images of each other, apart from any necessary differences in the alignment of the slits (52, 62) and cut outs (54, 64), the above description in relation to the first bottom plate (50) also apply to the second bottom plate (60).

Figure 11:
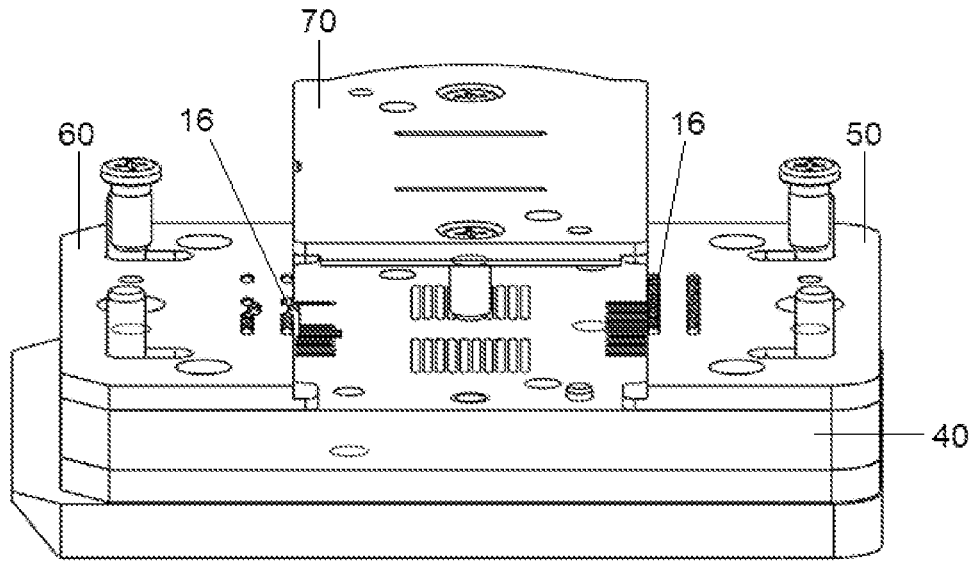
FIG. 11 shows a perspective view of a testing apparatus in a first main embodiment of the present invention.
Figure 12:
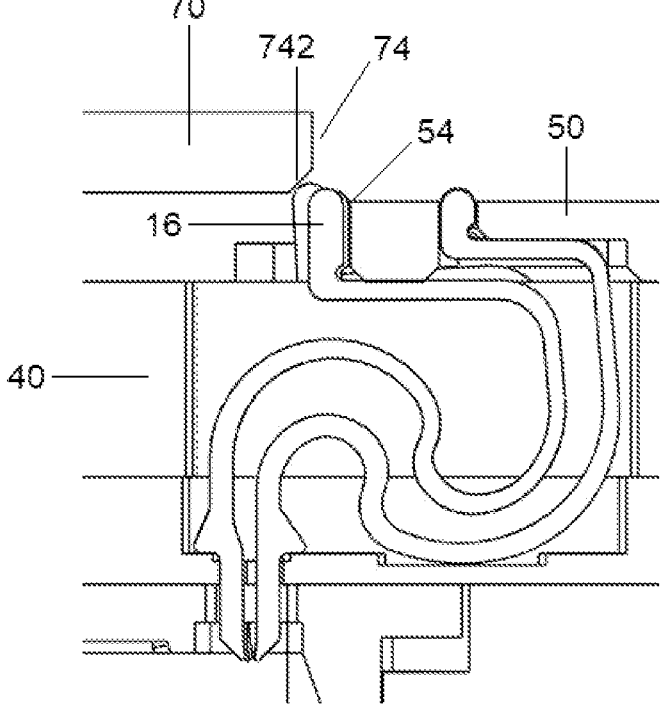
FIG. 12 shows a cross-sectional view of a testing apparatus in a first main embodiment of the present invention.

The subsequent alignment of any inner contact pin bottom ends (16) which are not yet aligned, let us look at FIGS. 11 and 12.

FIG. 11 shows the first bottom plate (50) and second bottom plate (60) already secured to the socket body (40), with the rows of outer contact pin bottom ends (26) aligned as desired. As mentioned above, the rows of inner contact pin bottom ends (16) may not be fully aligned yet, as they have merely been pushed to the inner side of the cut outs. There is shown a center cover plate (70) being lowered in the z-axis and towards the socket body (40). Once fully lowered onto the socket body (40), the center cover plate (70) sits adjacent to and snugly in between the first bottom plate (50) and the second bottom plate (60).

Referring now to FIG. 12, there is shown a close-up view of one side of the center cover plate (70). As the same principle applies to each side of the center cover plate (70), the following description on the side adjacent to the first bottom plate (50) also applies to the side adjacent to the second bottom plate (60). The center cover plate (70) is provided with a chamfer on an upper edge (742) on a side adjacent to the first bottom plate (50). As the center cover plate (70) is lowered onto the socket body (40), the chamfer catches any misaligned inner contact pin bottom ends (16) and pushes them into alignment with the first bottom plate cut out (54).

As mentioned, the desired alignment of the inner contact pins bottom ends (16) is not always a straight line. In the instance where the row of inner contact pin bottom ends (16) does not form a straight line, and the first bottom plate cut out (54) has an uneven profile, it is necessary to form a matching cut out (74) on the side of the center cover plate (70) adjacent to the first bottom plate (50), as shown in FIG. 13. In this instance, when the center cover plate (70) is fully lowered onto the socket body (40), a slit is formed by the conjunction of the center cover plate cut out (74) and the first bottom plate cut out (54). The cut out (74) is likewise provided with a chamfer on its upper edge (742), to facilitate easier inclusion, or "combing" of any misaligned inner contact pin bottom ends (16). In this way, as the center cover plate (70) is lowered onto the socket body, the chamfer on the cut out (74) catches any misaligned inner contact pin bottom ends (16) and forces them into alignment and into the said formed slit.

As mentioned, in this example of testing apparatus, there are four sides: two rows of kelvin contact pin pairs on two opposite sides, and two rows of single contact pins on the other two sides. The second main embodiment covering alignment of a single row of contact pins is described below in FIGS. 14 through 16. The principle of using a chamfer on upper edges of the bottom plates and center cover plate to provide wider openings on the upper side of the slits which facilitate easier inclusion or "combing" of the misaligned contact pins is the same for both the first main embodiment and the second main embodiment, so the following description will be kept brief and concise.

Moving on now to the second main embodiment of this invention, which is a method of aligning only one row of contact pins, FIGS. 14 and 15 show different angles of a contact pin (30) having a top end (32), curved body (34) and bottom end (36). A row of these contact pins (30) is inserted into third slots (46) embedded in a socket body (40), which has been turned upside-down. A center cover plate (70) is lowered down in the z-axis towards the socket body (40). The center cover plate (70) is provided with a slit (76), which is a through opening in the center cover plate (70) elongated in the x-axis. This slit (76) is chamfered along both its inner upper edge (762) and outer upper edge (764). This chamfering results in an upper opening of the slit to be wider than its lower opening. The wider opening of the lower side of the slit (76) facilitates easier inclusion of all misaligned contact pin bottom ends (36) into the slit (76), so that further lowering of the center cover plate (70) towards the socket body (40) forces all contact pins bottom ends (36) to be aligned as desired, that is along the profile on the lower side of the slit (76).

Still referring to FIGS. 14 and 15, although the alignment method of this invention can be applied to many types and shapes of pin, it works especially well for the pin design as seen in these figures, whereby each said contact pin body (34) comprises an upwards curve joined to a downwards curve, which curves form an "S" shape in a middle portion of said contact pin (30), and the said contact pin bottom end (36) extends vertically from a right-angle joint with said body (34).

The above also applies to the fourth side of the testing apparatus, since it too has only a single row of contact pins.

FIG. 16 shows the center cover plate (70) fully lowered onto the socket body (40). The row of contact pin bottom ends (36) has now been aligned as desired and contained within the slits (76, 77) of the center cover plate (70) with the help of chamfers on the upper edges (762, 764, 772, 774) of each slit.

Figure 17:
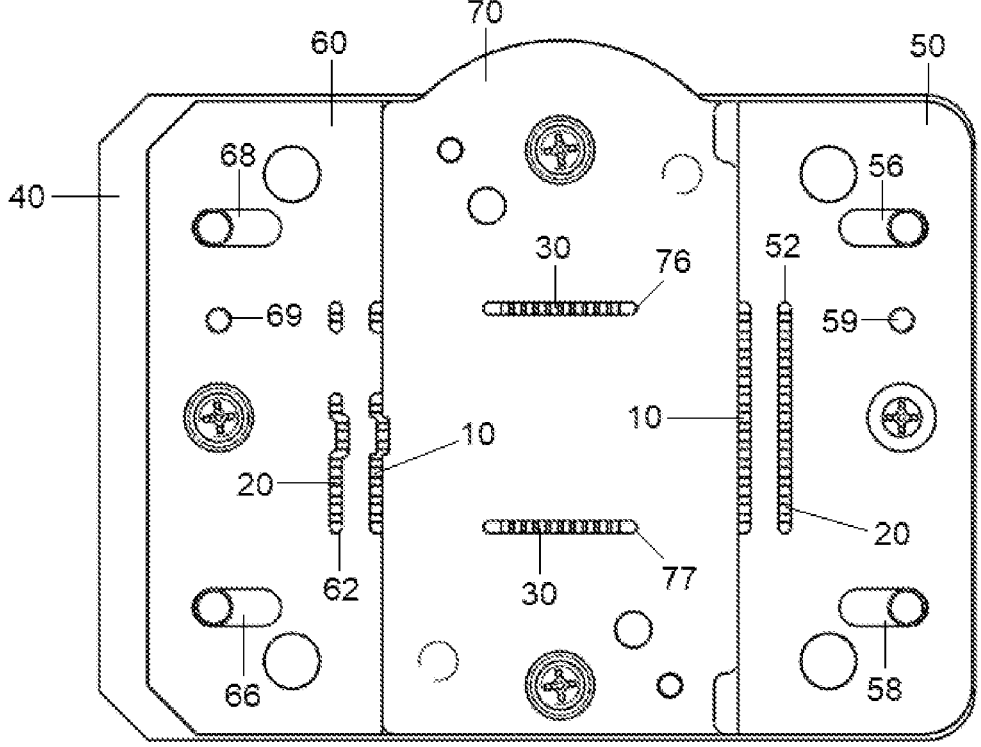
FIG. 17 shows a top view of a testing apparatus in an embodiment of the present invention.

FIG. 17 shows the bottom of the fully assembled testing apparatus. There is shown the socket body (40), first bottom plate (50), first bottom plate slit (52), first bottom plate first through hole (56), first bottom plate second through hole (58), first bottom plate reference through hole (59), second bottom plate (60), second bottom plate slit (62), second bottom plate first through hole (66), second bottom plate second through hole (68), second bottom plate reference through hole (69), center cover plate (70), center cover plate first slit (76), center cover plate second slit (77), inner contact pins (10), outer contact pins (20), contact pins (30).

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. A method for aligning a row of contact pin pairs in an integrated circuit (IC) device testing apparatus, comprising:
   a. placing a row of inner contact pins and a row of outer contact pins, each inner contact pin and its corresponding outer contact pin forming a contact pin pair, into a row of slots located on a socket body, each said inner contact pin having a top end for electrically contacting a corresponding contact pad of an IC device under test, and a bottom end for electrically contacting a corresponding contact pad of a load board, and each said outer contact pin having a top end for electrically contacting a corresponding contact pad of an IC device under test, and a bottom end for electrically contacting a corresponding contact pad of a load board; and
   b. lowering a first bottom plate towards said socket body, said first bottom plate provided with a slit with a profile that matches the desired final alignment of said row of outer contact pin bottom ends, said slit chamfered on at least one of its upper edges such that an upper opening of said slit is wider than a lower opening of said slit, said wider upper opening allowing for easier inclusion of any misaligned outer contact pin bottom ends into said slit so that all outer contact pin bottom ends are then aligned as desired once said first bottom plate is fully lowered onto said socket body.

2. The method for aligning a row of contact pin pairs in an integrated circuit (IC) device testing apparatus according to claim 1, wherein said first bottom plate is provided with a cut out at its inner side with a profile that matches the desired final alignment of said row of inner contact pin bottom ends, said cut out chamfered on its upper edge allowing for easier inclusion of any misaligned inner contact pin bottom ends into said cut out so that all inner contact pin bottom ends are moved to said inner side of the cut out once said first bottom plate is fully lowered onto said socket body, and further comprising the step of:

c. lowering a center cover plate towards said socket body, said center cover plate located adjacent to said first bottom plate and provided with a chamfer on an upper edge of a side that is adjacent to the first bottom plate cut out, said chamfer allowing for easier inclusion of any misaligned inner contact pin bottom ends into a slit formed by said center cover plate cut out and said first bottom plate cut out once the center cover plate is fully lowered onto the socket body.

3. The method for aligning a row of contact pin pairs in an integrated circuit (IC) device testing apparatus according to claim 1, wherein the said center cover plate is located adjacent to said first bottom plate and provided with a cut out that is adjacent to and having a matching profile with the first bottom plate cut out, said cut out chamfered on its upper edge allowing for easier inclusion of any misaligned inner contact pin bottom ends into a slit formed by said center cover plate cut out and said first bottom plate cut out once the center cover plate is fully lowered onto the socket body.

4. The method for aligning a row of contact pin pairs in an integrated circuit (IC) device testing apparatus according to claim 1, wherein the said first bottom plate is provided with at least one through-hole, each said at least one through-hole positioned to receive an upwards-protruding dowel pin, each said at least one through-hole elongated in an x-axis so that once said dowel pin is engaged through it, the entire first bottom plate is able to move primarily only in the x-axis direction and only in a range provided by the elongation of the said through-hole.

5. The method for aligning a row of contact pin pairs in an integrated circuit (IC) device testing apparatus according to claim 4, wherein the said dowel pin protrudes upwards at least to a height that allows its said engagement with said through-hole to happen before said row of outer contact pin bottom ends reaches said upper opening of said slit and also before said row of inner contact pin bottom ends reaches said upper edge of said cut out, as said first bottom plate is lowered onto said socket body.

6. The method for aligning a row of contact pin pairs in an integrated circuit (IC) device testing apparatus according to claim 4, wherein the said first bottom plate is provided with a means of securing its position with respect to said socket body once the said rows of outer contact pin bottom ends have been aligned into said slit.

7. The method for aligning a row of contact pin pairs in an integrated circuit (IC) device testing apparatus according to claim 1, wherein each said inner contact pin has a body portion in between the said bottom end and said top end, said body comprising an upwards curve joined to a downwards curve, which curves form an "S" shape in a middle portion of said inner contact pin, and the said inner contact pin bottom end extending vertically from a right-angle joint with said body, and wherein each said outer contact pin has a body portion in between the said bottom end and said top end, said body comprising an upwards curve joined to a downwards curve, which curves form an "S" shape in a middle portion of said outer contact pin, and the said outer contact pin bottom end extending vertically from a right-angle joint with said body.

8. A method for aligning a row of contact pins in an integrated circuit (IC) device testing apparatus, comprising:

a. placing a row of contact pins into a row of slots located on a socket body, each said contact pin having a top end for electrically contacting a corresponding contact pad of an IC device under test, and a bottom end for electrically contacting a corresponding contact pad of a load board; and b. lowering a center cover plate towards said socket body, said center cover plate provided with a slit with a profile that matches the desired final alignment of said row of contact pin bottom ends, said slit chamfered on at least one of its upper edges such that an upper opening of said slit is wider than a lower opening of said slit, said wider upper opening allowing for easier inclusion of any misaligned contact pin bottom ends into said slit so that all contact pin bottom ends are then aligned as desired once said center cover plate is fully lowered onto said socket body.

9. The method for aligning a row of contact pin pairs in an integrated circuit (IC) device testing apparatus according to claim 8, wherein the said center cover plate is provided with a means of securing its position with respect to said socket body once the said rows of contact pin bottom ends have been aligned into said slit.

10. The method for aligning a row of contact pin pairs in an integrated circuit (IC) device testing apparatus according to claim 8, wherein each said contact pin has a body in between the said bottom end and said top end, said body comprising an upwards curve joined to a downwards curve, which curves form an "S" shape in a middle portion of said contact pin, and the said contact pin bottom end extending vertically from a right-angle joint with said body.

* * * * *